United States Patent
Boni et al.

(10) Patent No.: US 12,084,341 B2
(45) Date of Patent: Sep. 10, 2024

(54) MEMS DEVICE HAVING AN IMPROVED STRESS DISTRIBUTION AND MANUFACTURING PROCESS THEREOF

(71) Applicant: STMicroelectronics S.r.l., Agrate Brianza (IT)

(72) Inventors: Nicolo' Boni, BG (IT); Lorenzo Vinciguerra, Novara (IT); Roberto Carminati, Piancogno (IT); Massimiliano Merli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 150 days.

(21) Appl. No.: 17/499,297

(22) Filed: Oct. 12, 2021

(65) Prior Publication Data
US 2022/0119245 A1    Apr. 21, 2022

(30) Foreign Application Priority Data
Oct. 15, 2020   (IT) .......................... 102020000024352

(51) Int. Cl.
*B81C 1/00*    (2006.01)
*B81B 3/00*    (2006.01)

(52) U.S. Cl.
CPC ........ *B81B 3/0072* (2013.01); *B81C 1/00182* (2013.01); *B81C 1/00198* (2013.01); *B81B 2203/033* (2013.01); *B81C 2201/019* (2013.01)

(58) Field of Classification Search
CPC ............ B81B 3/0072; B81B 2201/042; B81B 3/0045; B81B 2203/058; B81B 2203/0154; B81B 2203/0315; B81C 1/00142; G02B 26/0833; G02B 26/0825
See application file for complete search history.

(56) References Cited

U.S. PATENT DOCUMENTS

| | | | |
|---|---|---|---|
| 2017/0369306 A1* | 12/2017 | Bieselt | B81B 7/0054 |
| 2018/0178251 A1* | 6/2018 | Foncellino | B06B 1/0622 |
| 2020/0249463 A1* | 8/2020 | Suzuki | G02B 26/101 |

FOREIGN PATENT DOCUMENTS

| | | | |
|---|---|---|---|
| EP | 3276392 A1 | 1/2018 | |
| EP | 3636588 A1 | 4/2020 | |
| JP | 2009213296 A | 9/2009 | |
| JP | 2013051748 A | * | 3/2013 |
| JP | 20132013051748 A | 3/2013 | |

OTHER PUBLICATIONS

IT Search Report and Written Opinion for IT Appl. No. 102020000024352 dated Jun. 8, 2021 (7 pages).

* cited by examiner

*Primary Examiner* — Moazzam Hossain
(74) *Attorney, Agent, or Firm* — Crowe & Dunlevy LLC

(57) ABSTRACT

A MEMS device is formed by a body of semiconductor material which defines a support structure. A pass-through cavity in the body is surrounded by the support structure. A movable structure is suspended in the pass-through cavity. An elastic structure extends in the pass-through cavity between the support structure and the movable structure. The elastic structure has a first and second portions and is subject, in use, to mechanical stress. The MEMS device is further formed by a metal region, which extends on the first portion of the elastic structure, and by a buried cavity in the elastic structure. The buried cavity extends between the first and the second portions of the elastic structure.

12 Claims, 7 Drawing Sheets

MEMS DEVICE HAVING AN IMPROVED STRESS DISTRIBUTION AND MANUFACTURING PROCESS THEREOF

RELATED APPLICATION

This disclosure claims priority to Italian Patent Application Number 102020000024352, filed Oct. 15, 2020, the contents of which are incorporated by reference in their entirety to the maximum extent allowable under the law.

TECHNICAL FIELD

This disclosure relates to a MEMS device having improved stress distribution and to the manufacturing process therefor.

BACKGROUND

As known, MEMS ("Micro Electro Mechanical Systems") electronic devices such as actuators and/or sensors are typically formed in a substrate accommodating a cavity, and comprise a movable structure which is suspended on the cavity and constrained to a fixed region through elastic elements. The substrate, the movable structure and the elastic elements may be monolithic and are generally formed of semiconductor material, for example silicon.

These electronic devices further comprise one or more actuation and/or detection structures, coupled to the movable structure, and an electric control circuit, integrated in the same substrate or formed in a different substrate and coupled to the actuation and/or detection structures, capable of providing electrical drive signals to the actuation structures and/or receiving electrical detection signals from the detection structures.

In detail, the actuation structures, when controlled by the respective electrical drive signals, may cause a displacement, for example a rotation, of the movable structure. Similarly, the detection structures are configured to generate respective electrical signals, which are a function of an operating condition of the movable structure, and for example are a function of the rotation extent of the movable structure.

The electric control circuit and the actuation and/or detection structures are generally electrically connected to each other through conductive tracks, for example formed by a stack of conductive layers.

The conductive tracks typically extend on the fixed region, on the elastic elements, and sometimes partially on the movable structure.

In use, the displacement of the movable structure causes a deformation, for example a torsion, of the elastic elements which constrain the movable structure to the fixed region.

The deformation of the elastic elements generates mechanical stress in the elastic elements themselves and in the conductive tracks integral therewith.

If the mechanical stress has a high value, for example if it exceeds the plastic deformation threshold of the materials that form the conductive tracks, the conductive tracks may be subject to delamination and/or breakage. Consequently, the electrical connection between the electric control circuit and the actuation and/or detection structures may be compromised and the MEMS electronic device may be subject to malfunctions or breakage.

At present, MEMS devices, for example micromirrors, are known wherein the conductive tracks are formed by a specific stack of materials having a high number of metal layers designed to have a greater resistance to mechanical stress. However, this involves a high complexity of design and formation of the conductive tracks; in fact, for example, the number and the material of the metal layers are modified according to the stress resistance requirements imposed by the specific application.

Furthermore, the conductive tracks may be manufactured using complex chemical/physical processes capable of avoiding the formation of accidental structures such as unwanted over-etching. However, this involves the use of more complex and expensive processes, resulting in an increase in complexity and costs of production of the MEMS device. Furthermore, these precautions may prove to be insufficient to reduce the probability of breakage of the conductive tracks during use.

Furthermore, MEMS micromirrors are known wherein the rotation amplitude of the movable structure is voluntarily maintained within a reduced angle range, for example of a few degrees, in order to reduce the mechanical stress and thus the probability of breakage of the conductive tracks. However, this is not achievable in specific applications wherein high rotation angles of the movable structure are desired.

Therefore, further development is needed.

There is a need to overcome the drawbacks of the prior art.

SUMMARY

Embodiments herein concern a MEMS device and a manufacturing process.

For example, disclosed herein is a MEMS device including: a body of semiconductor material defining a support structure, wherein a pass-through cavity is defined in the body of semiconductor material and is surrounded by the support structure; a movable structure suspended in the pass-through cavity; an elastic structure extending in the pass-through cavity between the support structure and the movable structure, the elastic structure having a first portion and a second portion and being subject to mechanical stress; a metal region extending on the first portion of the elastic structure; wherein the elastic structure has a buried cavity define therein; and wherein the buried cavity extends between the first and the second portions of the elastic structure.

The first portion of the elastic structure may have a smaller thickness than the second portion of the elastic structure.

The first portion of the elastic structure may have a thickness between 1 μm and 10 μm, and the second portion of the elastic structure may have a thickness between 10 μm and 400 μm.

The height of the buried cavity may be between one fiftieth and one fifth of the thickness of the elastic structure.

The elastic structure may have a length along a first direction and the buried cavity may extend for an entirety of the length of the elastic structure along the first direction.

The buried cavity may also extend partially inside the movable structure and partially inside the support structure.

The buried cavity may have a width, along a second direction, which is equal to a width of the elastic structure.

The metal region may have a width, along a second direction, which is smaller than a width of the buried cavity.

The device may be configured to define a micromirror. A reflective region may be arranged on the movable structure, on an opposite side with respect to the pass-through cavity.

Also disclosed herein is a process of manufacturing a MEMS device from a work body of semiconductor material. The process includes: forming a buried cavity in the work body; forming a pass-through cavity in the work body, the pass-through cavity defining a support structure surrounding the pass-through cavity; forming a movable structure suspended in the pass-through cavity; forming an elastic structure extending in the pass-through cavity between the support structure and the movable structure, wherein the buried cavity is formed to extend at the elastic structure and separate a first portion and a second portion of the elastic structure from one other; and forming a metal region on the first portion of the elastic structure.

Forming the buried cavity may include: excavating, from a first surface of the work body, a plurality of trenches delimiting semiconductor pillars; growing an epitaxial layer on the first surface of the work body; annealing the work body to thereby cause a migration of the semiconductor atoms from the semiconductor pillars to the epitaxial layer; forming of the buried cavity; and forming a closing layer.

The trenches may have a depth between 5 μm and 20 μm. Each semiconductor pillar may be at a distance between 0.1 μm and 5 μm from an adjacent semiconductor pillar.

Forming a metal region may include forming at least one metal layer on a first surface of the work body, the at least one metal layer extending over the buried cavity and having a smaller width than a width of the buried cavity.

The work body may be formed by a structural layer of a first semiconductor material and by a work substrate of a second semiconductor material, the structural layer being delimited by a first surface of the work body and by a bonding surface, opposite to the first surface of the work body, the work substrate being bonded to the bonding surface of the structural layer and being delimited by a second surface of the work body, opposite to the first surface.

Forming a pass-through cavity may include: selectively removing the work substrate from the second surface of the work body, up to the bonding surface of the structural layer to form a bottom cavity; and selectively removing the structural layer, from the first surface of the work body, up to the bonding surface of the structural layer.

Selectively removing the structural layer may include: forming a mask region on the first surface of the work body, the mask region defining a shaping portion having, on the buried cavity, a smaller width than the buried cavity; and etching the work body, using the mask region, wherein the shaping portion defines the elastic structure.

Also disclosed herein is a MEMS device, including: a body of semiconductor material defining a support structure; wherein a pass-through cavity is defined in the body of semiconductor material and is surrounded by the support structure; a movable structure suspended in the pass-through cavity and coupled to the support structure through a plurality of elastic elements, the plurality of elastic elements being formed in the body of semiconductor material; an elastic structure extending in the pass-through cavity between the support structure and the movable structure, the elastic structure comprising a first portion and a second portion and being subject to mechanical stress; a metal region extending on the first portion of the elastic structure; and at least one insulating layer disposed on the body of semiconductor material; wherein the at least one insulating layer has defined therein a pair of trenches extending therethrough into at least a portion of a thickness of the body of semiconductor material, the pair of trenches extending on opposite sides of the metal region.

A depth of each trench may be smaller than one half a thickness of the body of semiconductor material. The depth of each trench may be between 1 μm and 10 μm.

The pair of trenches may laterally delimit the first portion of the elastic structure. The first portion of the elastic structure may have a smaller thickness than the second portion of the elastic structure.

Also disclosed herein is a MEMS device, including: a body of semiconductor material defining a support structure; wherein a pass-through cavity is defined in the body of semiconductor material and is surrounded by the support structure; a movable structure suspended in the pass-through cavity and coupled to the support structure through a plurality of elastic elements, the plurality of elastic elements being formed in the body of semiconductor material; an elastic structure extending in the pass-through cavity between the support structure and the movable structure, the elastic structure comprising a first portion and a second portion and being subject to mechanical stress; a metal region extending on the first portion of the elastic structure; and at least one insulating layer disposed on the body of semiconductor material; wherein the movable structure is formed by a platform within the body of semiconductor material, the platform being carried by stiffening structures formed within an additional substrate.

The stiffening structures may be bonded to the platform through a bonding element. The stiffening structures may extend from the platform through the pass-through cavity.

The platform may have defined therein trenches extending from a bottom surface of the platform up to a superficial portion on the sides of the stiffening structures. The trenches may have a smaller depth than a thickness of the platform. The depth of the trenches may be between 1μm and 50 μm.

BRIEF DESCRIPTION OF THE DRAWINGS

For a better understanding, embodiments thereof are now described, purely by way of non-limiting example, with reference to the attached drawings, wherein.

DETAILED DESCRIPTION

Hereinafter, an electronic device made using MEMS ("Micro Electro Mechanical System") technology, in particular a MEMS micromirror, is described.

Figure 1:
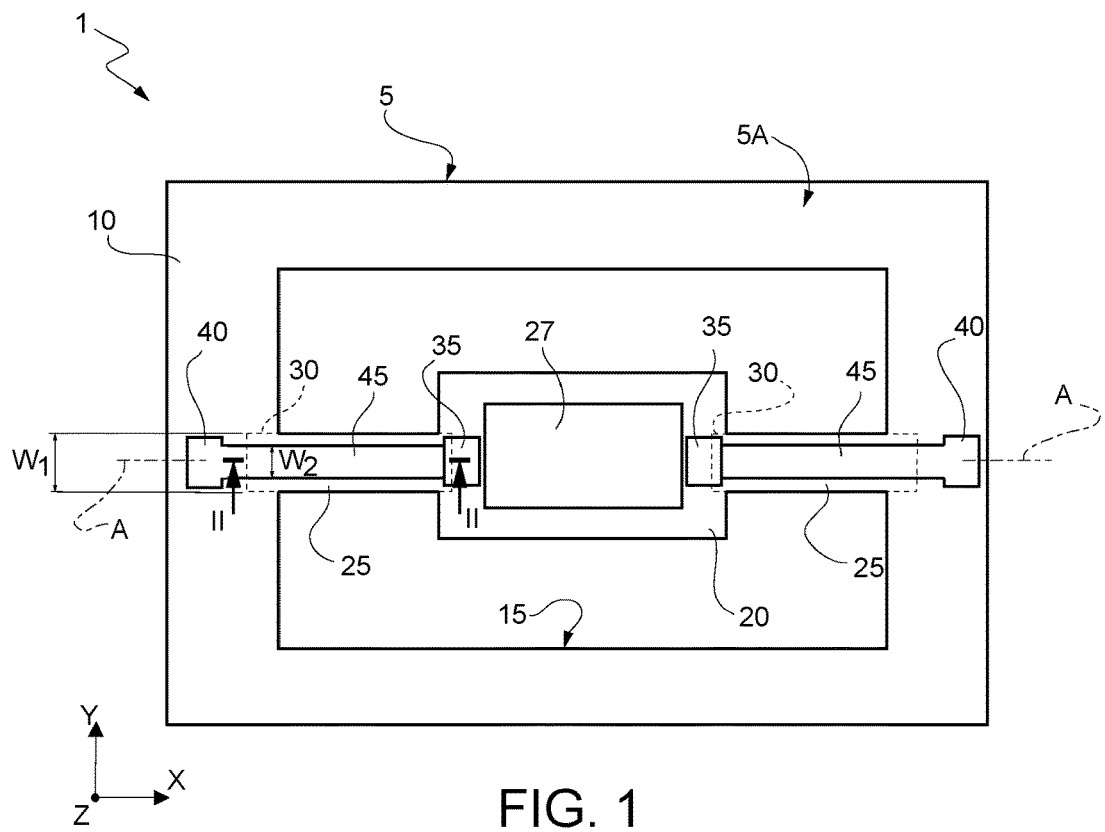
FIG. 1 shows a top plan view of an embodiment of the present MEMS device.
Figure 2:
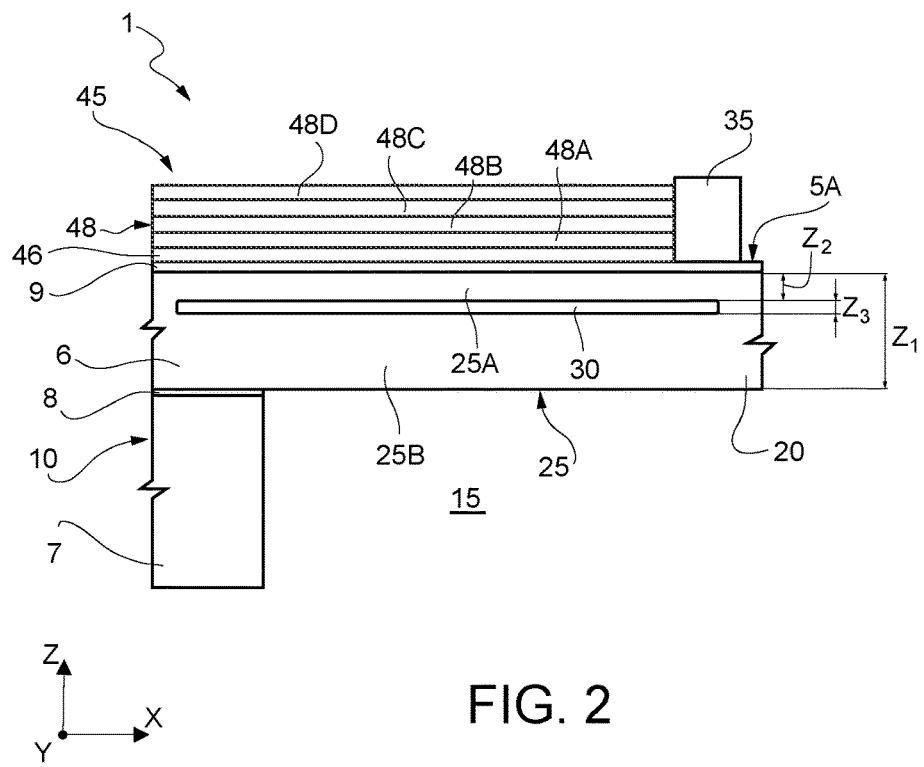
FIG. 2 shows a cross-section of the MEMS device of FIG. 1, taken along section line II-II of FIG. 1.

FIGS. 1 and 2 show a MEMS micromirror 1 symmetrical with respect to a rotation axis A, parallel to a first axis X of a Cartesian reference system XYZ.

The MEMS micromirror 1 is formed here in a die 5, which is delimited by a top surface 5A and comprises a plurality of substrates of semiconductor material, for example silicon, bonded to each other.

In this embodiment, the die 5 is formed by first and second substrates 6, 7, bonded to each other through a bonding element 8, for example of silicon oxide.

The first substrate 6 has a thickness $Z_1$, for example comprised between 15 μm and 400 μm, in particular of 65 μm, and is covered by one or more insulating layers, herein simply referred to as insulating layer 9, which is delimited by the top surface 5A of the die 5. The insulating layer 9 is thin, with a thickness for example smaller than 2 μm, and is therefore neglected hereinafter.

The second substrate 7 has a thickness, for example comprised between 50 μm and 400 μm, in particular of 150 μm, and may be bonded to a support substrate, not shown here, on the opposite side with respect to the first substrate 6.

The die 5 comprises a frame 10, surrounding a pass-through cavity 15, and a movable structure 20 suspended in the pass-through cavity 15 and coupled to the frame 10 through elastic elements 25.

The frame 10 is formed by the second substrate 7 and by the portion of the first substrate 6 bonded and superimposed thereto, while the movable structure 20 and the elastic elements 25 are formed by respective portions of the first substrate 6 suspended in the pass-through cavity 15.

In detail, the MEMS micromirror 1 comprises two elastic elements or springs 25, each being here bar-shaped, extending along the rotation axis A. Each elastic element 25 has a first anchoring end, integral with the frame 10, and a second anchoring end, integral with the movable structure 20, and a width $W_1$, parallel to a second axis Y of the Cartesian reference system XYZ, which is constant in the shown embodiment.

As visible in FIG. 2 and highlighted by a dashed line in FIG. 1, the MEMS micromirror 1 further comprises two buried cavities 30, one for each elastic element 25, arranged inside the first substrate 6, which extend for the whole length of the elastic elements 25 and thus divide each elastic element 25 into first and second portions 25A, 25B, superimposed with respect to each other.

The first portion 25A of the elastic elements 25 delimits here upwardly the buried cavities 30 and has a thickness comprised, for example between 1 μm and 10 μm, in particular of 5 μm.

The second portion 25B of the elastic elements 25 delimits here downwardly the buried cavities 30 and has a greater thickness than the first portion 25A, comprised for example between 10 μm and 400 μm, in particular of 50 μm.

In detail, each buried cavity 30 extends in the first substrate 6, spaced from the top surface 5A of the die 5 by a depth $Z_2$, measured along a third axis Z of the Cartesian reference system XYZ, comprised for example between 1 μm and 10 μm, in particular of 5 μm and has a height $Z_3$, for example comprised between one fiftieth and one fifth of the thickness $Z_1$ of the respective elastic element 25, for example comprised between 1 μm and 20 μm, in particular of 10 μm.

In detail, here, each buried cavity 30 has, along the first axis X, a greater length than the respective elastic element 25, so that each buried cavity 30 extends beyond the anchoring ends of the respective elastic element 25. In other words, each buried cavity 30 extends partially inside the frame 10 and partially inside the movable structure 20.

In this embodiment, each buried cavity 30 has, parallel to the second axis Y, an extension equal to the width $W_1$ of the respective elastic element 25; in other words, in this embodiment, the buried cavities 30 communicate with (i.e., open into) the pass-through cavity 15.

Consequently, the first and the second portions 25A, 25B of the elastic elements 25 are mechanically coupled to each other through the portions of the frame 10 and of the movable structure 20 adjacent to the ends of the buried cavities 30.

However, each buried cavity 30 may have a width smaller than the width $W_1$ and/or a length smaller than or equal to the respective elastic element 25, even if this, in some embodiments, may involve a greater mechanical coupling between the first and the second portions 25A, 25B.

The MEMS micromirror 1 further comprises one or more actuation structures 35, contact pads 40 and conductive tracks 45. The conductive tracks 45 extend between, and are in direct electrical connection with, the contact pads 40 and the actuation structures 35.

The actuation structures 35, here depicted schematically, may be for example of electromagnetic, piezoelectric or electrostatic type, are formed, and are coupled to the movable structure 20, so as to cause, in use, a rotation thereof around the rotation axis A.

In this embodiment, the actuation structures 35 are arranged on the movable structure 20, on the top surface 5A of the die 5.

The contact pads 40 and the conductive tracks 45 are used to electrically connect the actuation structures 35 to an electric circuit, not shown here, capable of providing and/or receiving electrical control signals of the MEMS micromirror 1. This electric circuit may be integrated in the die 5 or in a separate die, electrically connected to the die 5.

In detail, in the embodiment in question, the conductive tracks 45 are formed, as shown in FIG. 2, by a multilayer structure. In particular, here the multilayer structure comprises a seed layer 46, for example of copper, used during manufacturing and arranged in contact with the top surface 5A of the die 5, and a stack of conductive layers 48, whose number, thickness and material may vary according to the requirements of the specific application, for example according to the desired level of stress resistance or resistance to the passage of current.

In this embodiment, the stack of conductive layers 48 is formed by the succession of a first metal layer 48A, for example of nickel, directly overlying the seed layer 46, a second metal layer 48B, for example of gold, over the first metal layer 48A, a third metal layer 48C, for example of nickel, over the second metal layer 48B, and a fourth metal layer 48D, for example of gold, over the third metal layer 48C.

The conductive tracks 45 extend, at least partially, on the elastic elements 25, in a position contiguous to the insulating layer 9 and thus integral with the first portions 25A of the elastic elements 25, and have a width $W_2$, along the second axis Y, smaller than the width $W_1$ of the elastic elements 25 and thus smaller than the width of the buried cavities 30.

The MEMS micromirror 1 further comprises a reflective region 27, formed by one or more materials capable of reflecting a light radiation, and arranged on the movable structure 20, here on the top surface 5A of the die 5.

The reflective region 27 may, for example, be of aluminum, if the light radiation is in the visible frequency range, or of gold, if the light radiation is in the infrared frequency range.

In use, when it is desired to rotate the movable structure 20, and thus the reflective region 27, for example to direct a light beam, an electrical signal is provided by the electric control circuit to the actuation structures 35, which causes a rotation of the movable structure 20 around the rotation axis A.

The rotation of the movable structure 20 is accompanied by a deformation, in particular a torsion, of the elastic elements 25 around the rotation axis A.

The torsion of the elastic elements 25 generates a high mechanical stress in the elastic elements 25, both inside the elastic elements 25 and in the corresponding anchoring ends.

However, the form of the elastic elements 25, in particular the presence of the buried cavities 30 which decouple the first portion 25A from the second portion 25B of the respective elastic elements 25, causes the highest stress values to be distributed in the second portion 25B.

In fact, as described hereinabove, since the first and the second portions 25A, 25B are mechanically decoupled both along the first axis X and along the second axis Y, the first and the second portions 25A, 25B of each elastic element 25 behave, respectively, as first and second springs arranged in parallel.

Furthermore, the second portion 25B of each elastic element 25 has a greater thickness than the respective first portion 25A and thus has a greater elastic constant. Consequently, given the same deformation (torsion), the mechanical stress develops more in the second portion 25B.

Therefore, the first portion 25A, and thus also the respective conductive track 45 integral therewith, is subject to a lower mechanical stress. This causes the conductive tracks 45, arranged above the first portion 25A, which are less stressed, to be in turn subject to lower stress with respect to a case wherein the elastic elements 25 are solid.

Furthermore, since the buried cavities 30 extend beyond the anchoring ends of the elastic elements 25, the high stress values which generally form at the anchoring ends move inside the frame 10 and the movable structure 20 and are distributed therein, thus reducing the stress at the interface with the conductive tracks 45. Furthermore, the form and the position of the conductive tracks 45 on the frame 10 and on the movable structure 20 may be designed so that they are far from the most stressed points of the frame 10 and of the movable structure 20.

Simulations of the strcuture confirm that the described approach causes the mechanical stress in the conductive tracks 45 to remain below the stress threshold, for example lower than 200 MPa, beyond which plastic deformation of the metal layers forming the conductive tracks 45 occurs.

Consequently, the conductive tracks 45 are less subject to the risk of delamination and/or breakage during the rotation of the movable structure 20 and therefore the MEMS micromirror 1 has improved reliability.

This allows design of MEMS micromirrors whose movable structures 20 are able to rotate with a high rotation angle, for example with an angle around the rotation axis A up to ±25°, in particular of about ±9°, without the risk of delamination and/or break of the conductive tracks 45.

Figure 3:
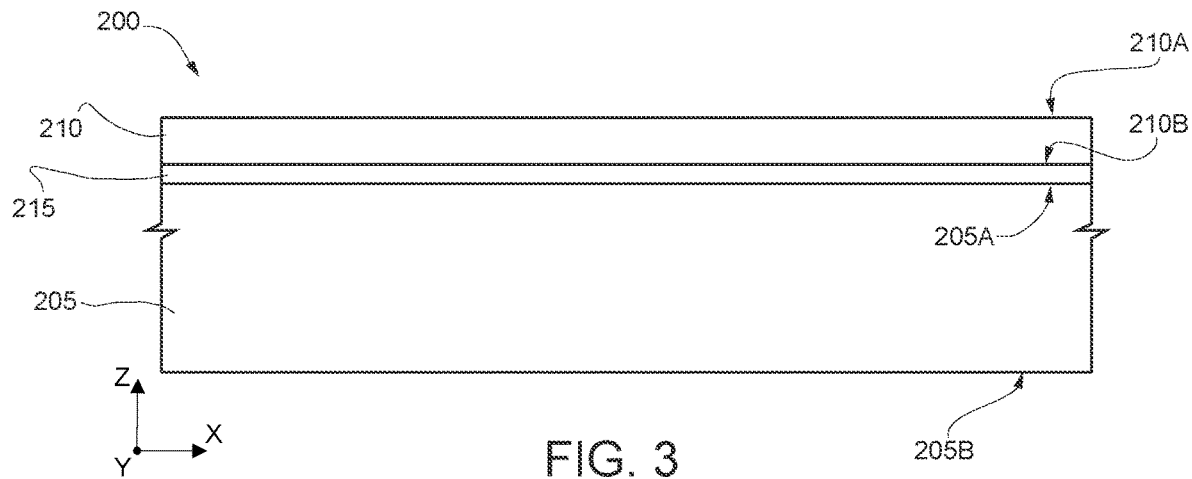
FIGS. 3-11 show cross-sections of the MEMS device of FIGS. 1 and 2 in successive manufacturing steps, taken along a section plane passing through the rotation axis A and identified by section line II-II of FIG. 2.

The MEMS micromirror 1 may be formed from a work body 200 (intended to form the die 5), for example a Silicon-on-Insulator (SOI) wafer, shown in FIG. 3, which includes a first layer 205 (intended to form the second substrate 7) of semiconductor material, for example monocrystalline silicon, and a structural layer 210 (intended to form the first substrate 6), also of semiconductor material, for example monocrystalline silicon, bonded to each other through a bonding layer 215, for example of silicon oxide.

The first layer 205 has first and second surfaces 205A, 205B and a thickness for example of 650 µm; the structural layer 210 has first and second surfaces 210A, 210B, and a thickness, for example comprised between 15 µm and 400 µm, in particular of 65 µm.

In detail, the first surface 205A of the first layer 205 is bonded to the second surface 210B of the structural layer 210.

Figure 4:
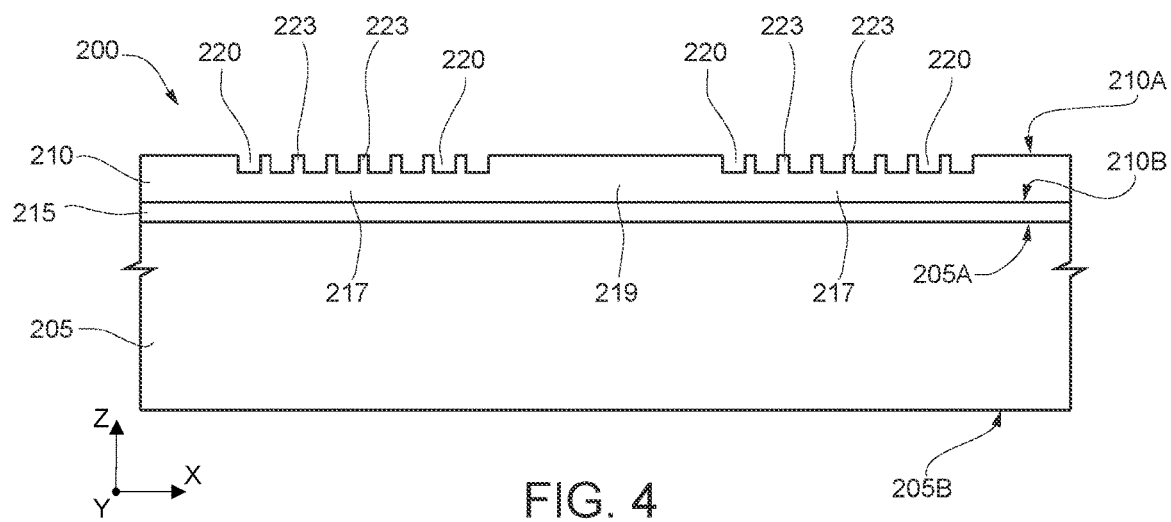

Subsequently, as shown in FIG. 4, work trenches 220 are formed in first portions 217 of the structural layer 210. In particular, a pair of first portions 217, separated from each other by a second portion 219 of the structural layer 210, is provided for each micromirror 1 to be formed. In detail, in each first portion 217, a group of work trenches 220 is formed, which delimit a respective plurality of pillars 223 of semiconductor material. The work trenches 220 are formed, for example, by using lithographic and selective etching steps from the first surface 210A of the structural layer 210.

For example, the work trenches 220 each have a depth comprised, for example, between 5 µm and 20 µm, and each pillar 223 is arranged at a distance comprised, for example, between 0.1 µm and 5 µm from an adjacent pillar 223.

Figure 5:
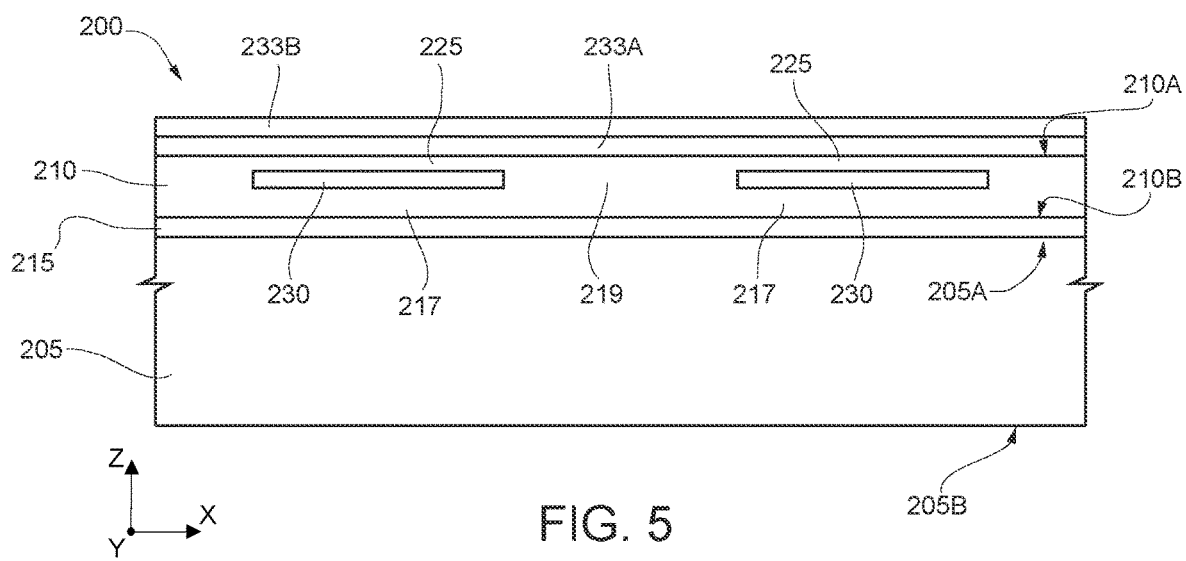

In FIG. 5, an epitaxial layer, for example of thickness comprised between 1 µm and 10 µm, is grown, through an epitaxial growth step, on the first surface 210A of the structural layer 210 (which thus increases in thickness; for simplicity the thickened epitaxial layer thus obtained is indicated again with 210). One or more annealing steps of the work body 200 are then performed, for example in a reducing environment, for example in a hydrogen atmosphere, at high temperatures, for example higher than 1000° C.

As described, for example, in U.S. Pat. No. 8,575,710 (European Patent No. 1,577,656), the contents of both of which are incorporated by reference, the one or more annealing steps cause a migration of the semiconductor atoms, here silicon, which tend to move to a lower energy position. Consequently, also due to the close distance between the plurality of pillars 223, the semiconductor atoms of the plurality of pillars 223 migrate completely, forming first work cavities 230, which are intended to form the buried cavities 30. The first work cavities 230 are delimited upwardly by a semiconductor layer, formed partially by epitaxially grown atoms and partially by migrated atoms, which forms a closing layer 225, which make up a portion of the structural layer, here again indicated by 210.

The height of the first work cavities 230 (and thus of the buried cavities 30) and the depth in the structural layer 210 at which they are buried may be adjusted, during the design step, by modifying the depth of the work trenches 220 and the thickness of the epitaxial layer on the first surface 210A of the structural layer 210 and/or by performing a further epitaxial growth.

Figure 7:
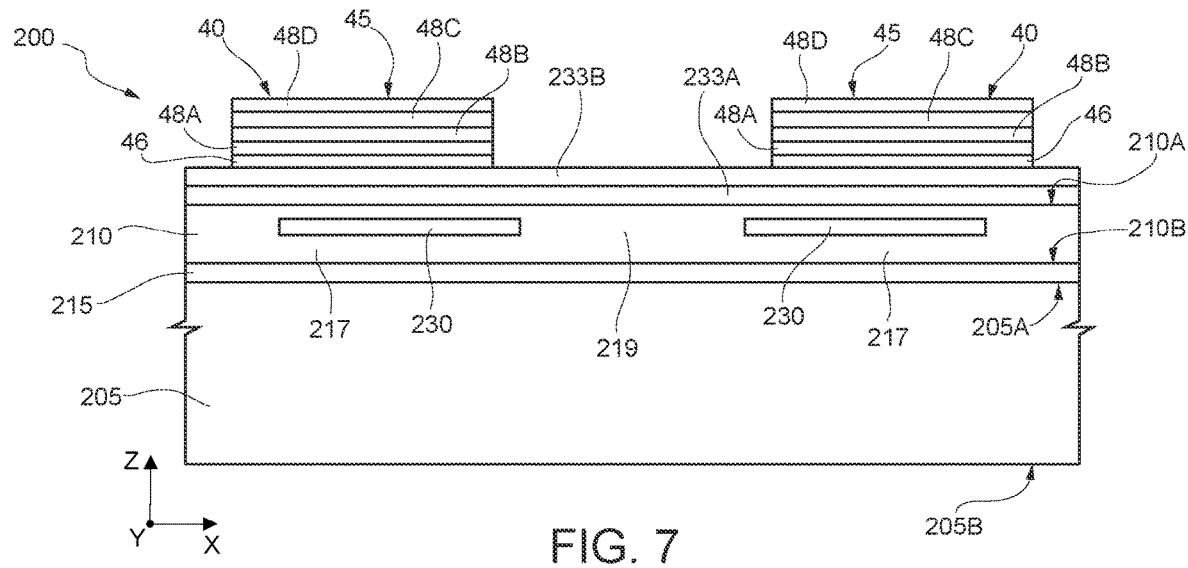
Figure 7A:
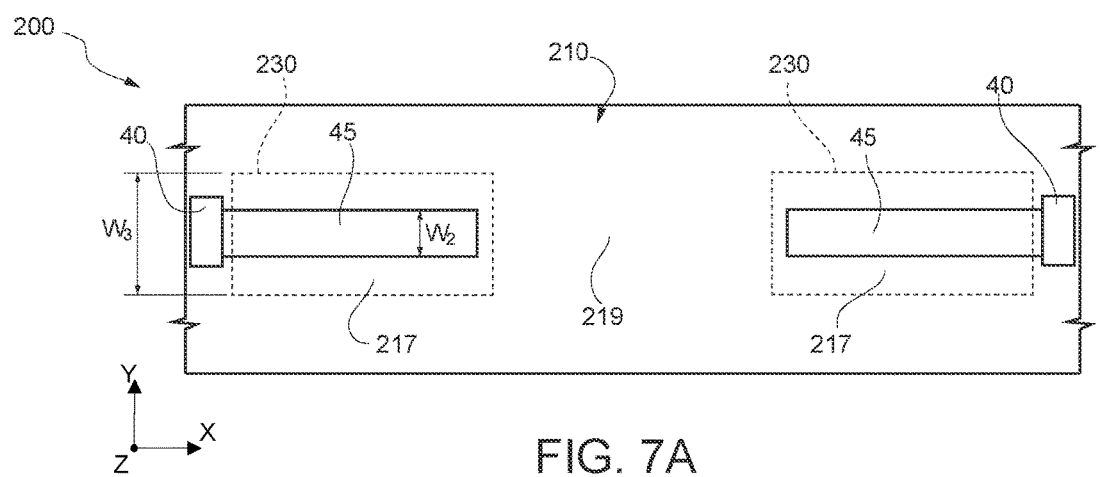
FIG. 7A shows a top plan view of the MEMS device of FIGS. 1 and 2 in the manufacturing step of FIG. 7.

In this embodiment, as visible in FIG. 7A, the first work cavities 230 have a width $W_3$, along the second axis Y, greater than the width $W_1$ of the buried cavities 30 of FIG. 1, so as to facilitate the manufacturing steps of the buried cavities 30.

However, the width $W_3$ of the first work cavities 230 may be equal to the width $W_1$ of the buried cavities 30 (i.e., equal to the width of the elastic elements 25).

Subsequently, again with reference to FIG. 5, one or more insulating layers, for simplicity indicated as insulating layer 9 in FIG. 1, are deposited on the first surface 210A of the structural layer 210.

In this embodiment, a first insulating layer 233A, for example of silicon oxide, and a second insulating layer 233B, for example of silicon nitride, are deposited on the first surface 210A of the structural layer 210.

Figure 6:
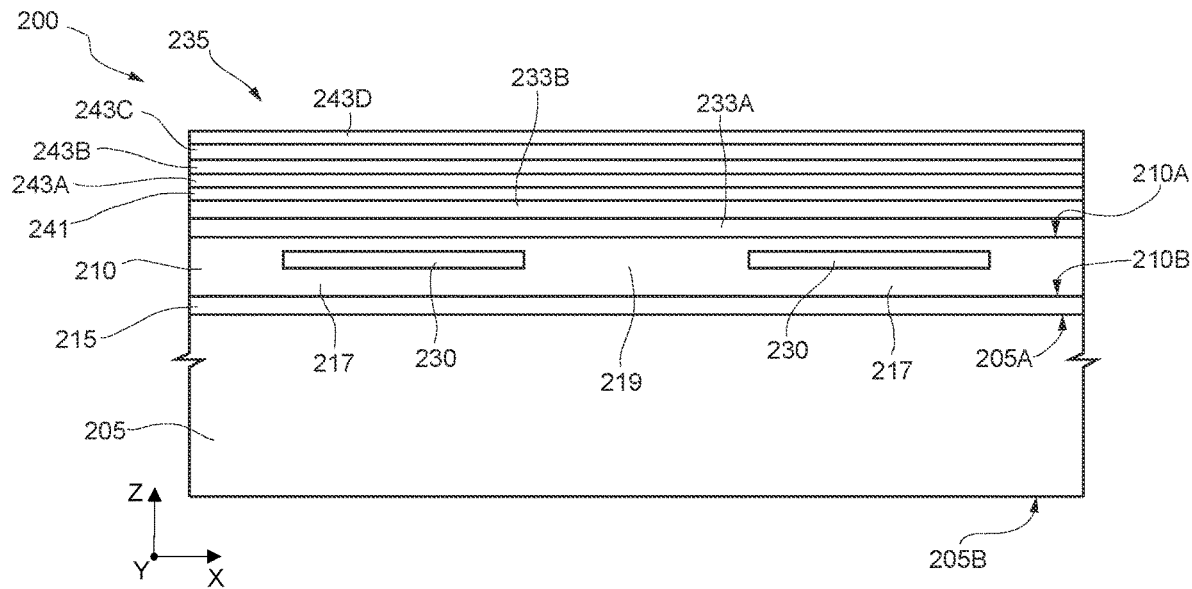

Subsequently, as shown in FIG. 6, a stack of conductive layers 235 is formed on the second insulating layer 233B. The conductive layers 235 comprise here a first seed layer 241, for example of copper, used for improving the adhesion of the successive conductive layers, and a first, a second, a third and a fourth metal layer 243A, 243B, 243C, 243D, for example of nickel, gold, nickel and gold, respectively. Then, as shown in FIG. 7, the stack of conductive layers 235 is shaped so as to form the contact pads 40 and the conductive tracks 45.

As visible in FIG. 7A in top plan view, wherein the first and the second insulating layers 233A, 233B are shown in transparency for clarity, the conductive tracks 45 extend, at least partially, on the pairs of first portions 217 of the structural layer 210; i.e., the conductive tracks 45 are each arranged above a respective first work cavity 230, herein depicted with a dashed line.

Figure 8:
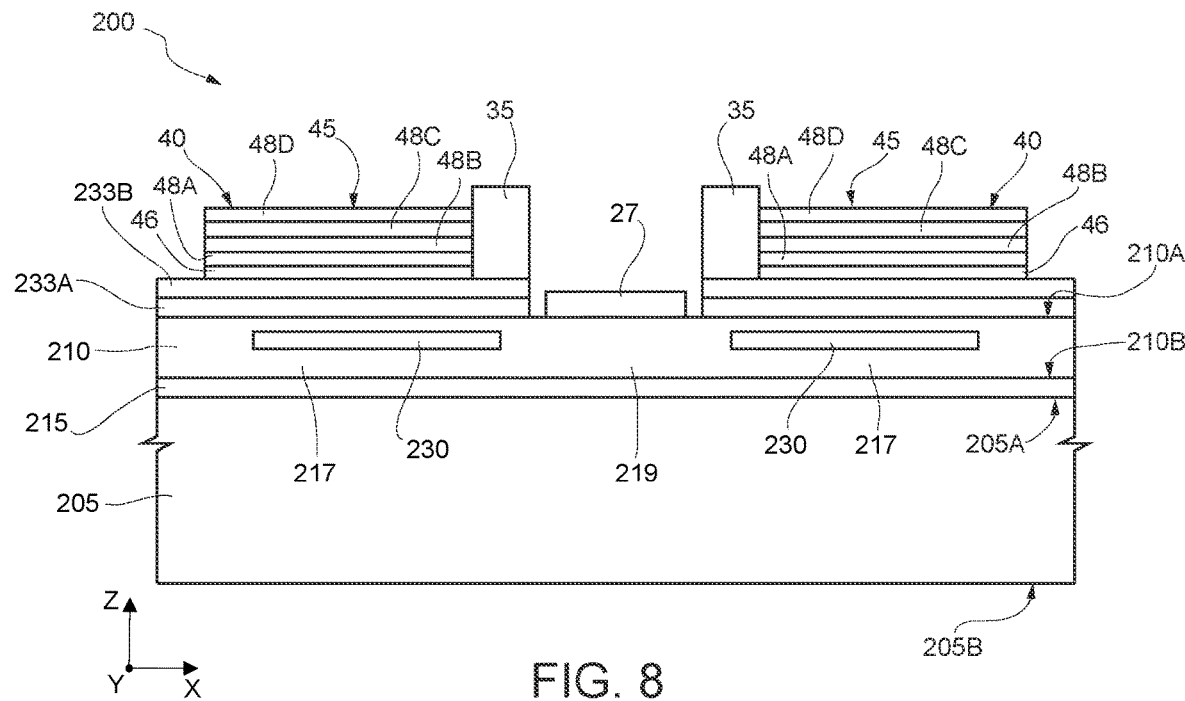

Then, as shown in FIG. 8, the actuation structures 35 are formed and selective etchings are performed to selectively remove the first and the second insulating layers 233A, 233B where the reflective region 27 is intended to be formed. The reflective region 27 is thus formed directly on the first surface 210A of the structural layer 210, for example, by depositing one or more materials capable of reflecting a light beam.

Figure 9:
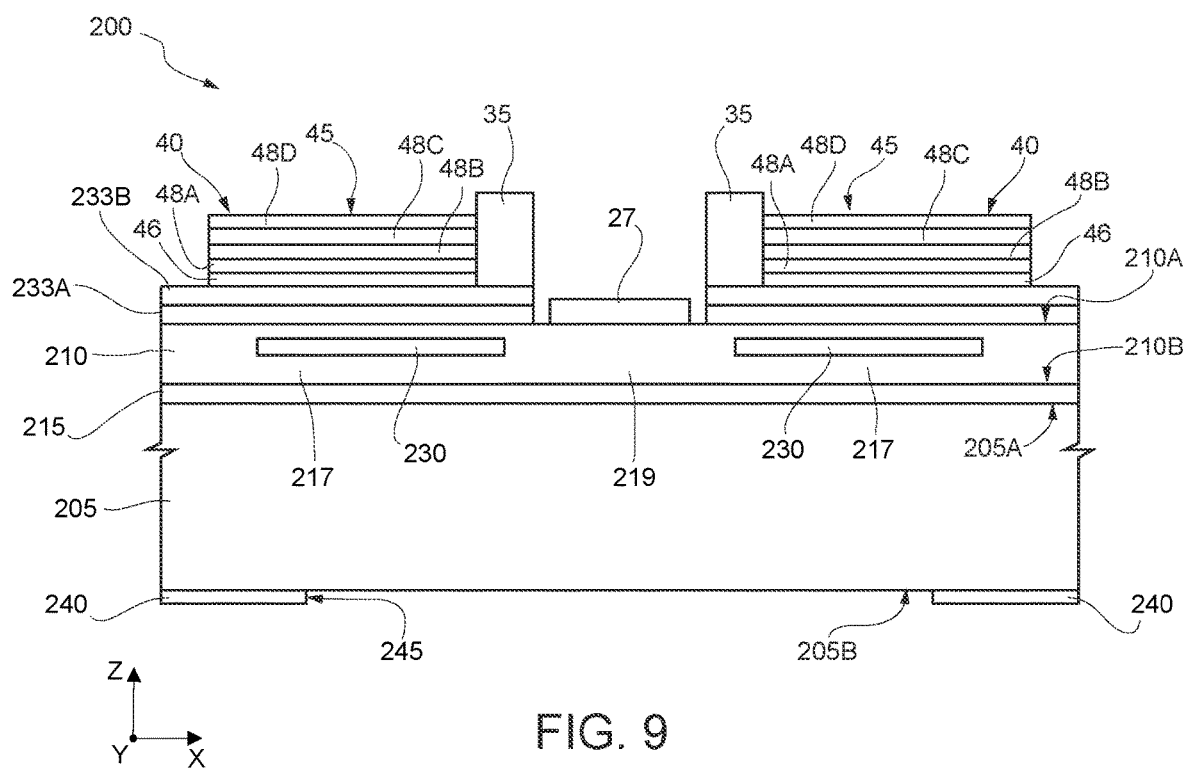

Subsequently, as shown in FIG. 9, a first mask layer 240 is deposited on the second surface 205B of the first layer 205 and is lithographically shaped so to form a first opening 245.

Figure 10:
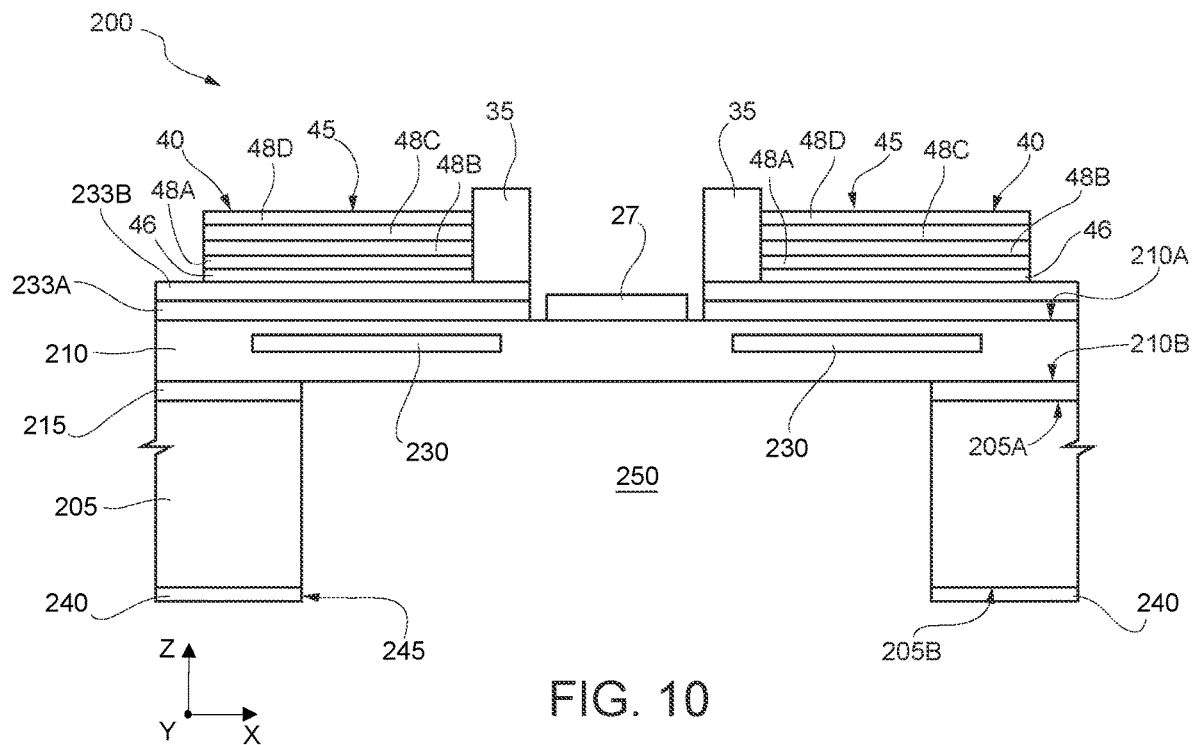

Then, as shown in FIG. 10, portions of the first layer 205 and of the bonding layer 215 are removed up to the second surface 210B of the structural layer 210, from the second surface 205B of the first layer 205, forming a second work cavity 250. For example, a series of selective etchings may be performed, using the first mask layer 240.

Figure 11:
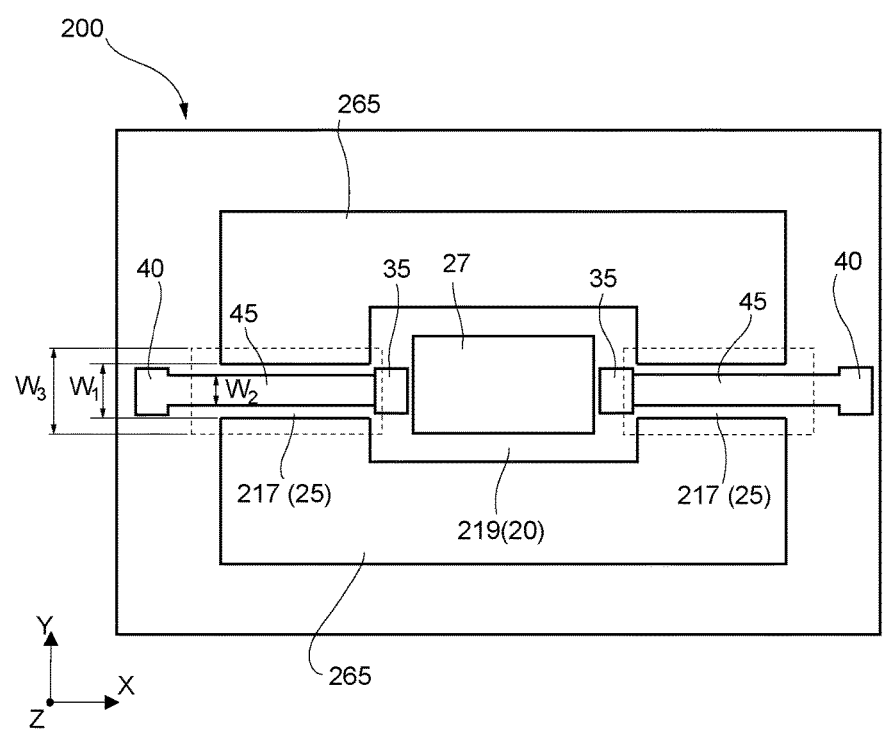

Then, as shown in FIG. 11, a second mask layer is deposited on the work body 200 and defined so to form a mask region (here shown in transparency) surrounding a second opening 265.

The second opening 265 faces the structural layer 210, in a position adjacent to the second portions 219 of the structural layer 210 and partially overlapping the first portions 217, on the side of the conductive tracks 45.

In particular, the mask region, at the conductive tracks 45, has width $W_1$ along the second axis Y, so as to completely cover the conductive tracks 45 and has a smaller width than the width $W_3$ of the first work cavities 230.

A series of selective etchings is then performed using the mask region, through the second opening 265, to remove the first and the second insulating layers 233A, 233B and the structural layer 210, up to the second surface 210B of the structural layer 210; i.e., so to communicate with the second work cavity 250 and thus forming the pass-through cavity 15.

In this manner, the first work cavities 230 communicate laterally with the pass-through cavity 15 and form the buried cavities 30.

Furthermore, the remaining parts of the pairs of first portions 217 and of the second portion 219 of the structural layer 210 form, respectively, the elastic elements 25 and the movable structure 20.

Processing steps follow, such as, for example, thinning of the first layer 205, dicing of the work body 200, and packaging of the corresponding die, so as to form the MEMS micromirror 1.

Figure 12:
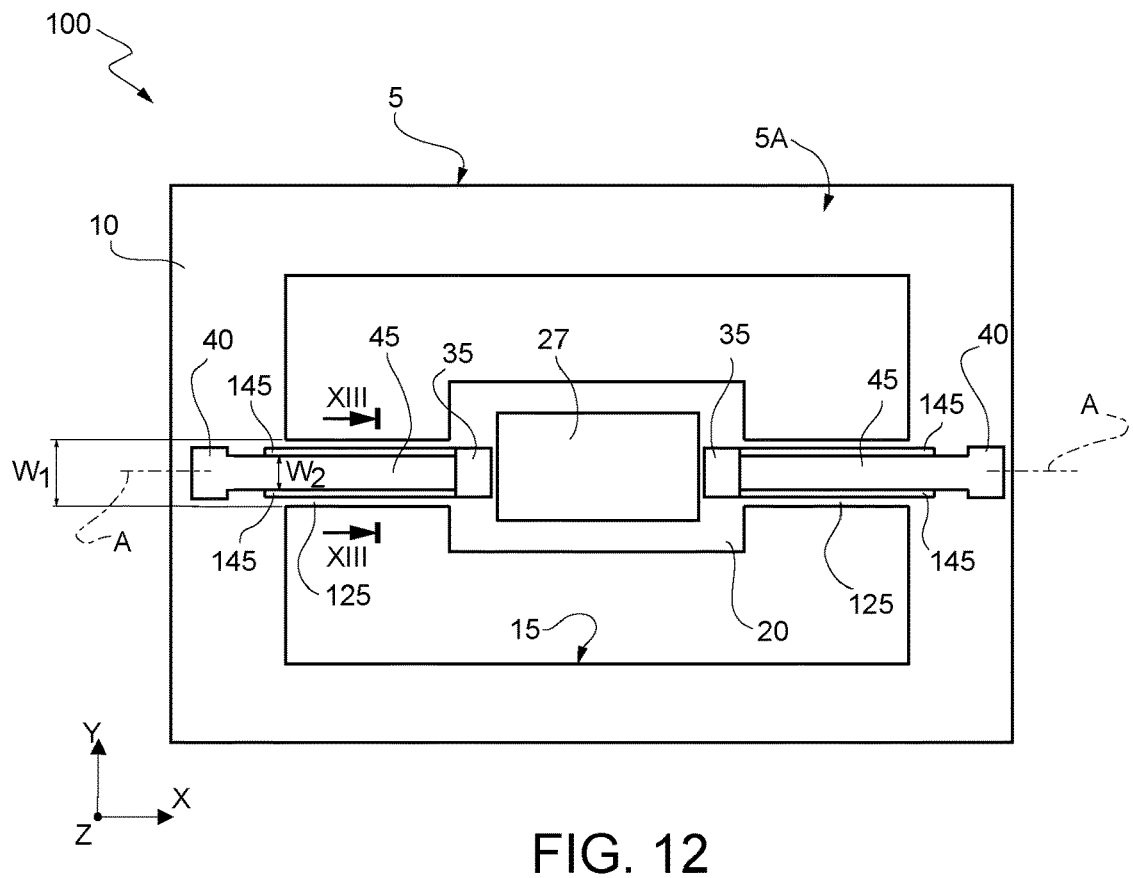
FIG. 12 shows a top plan view of a different embodiment of the present MEMS device.
Figure 13:
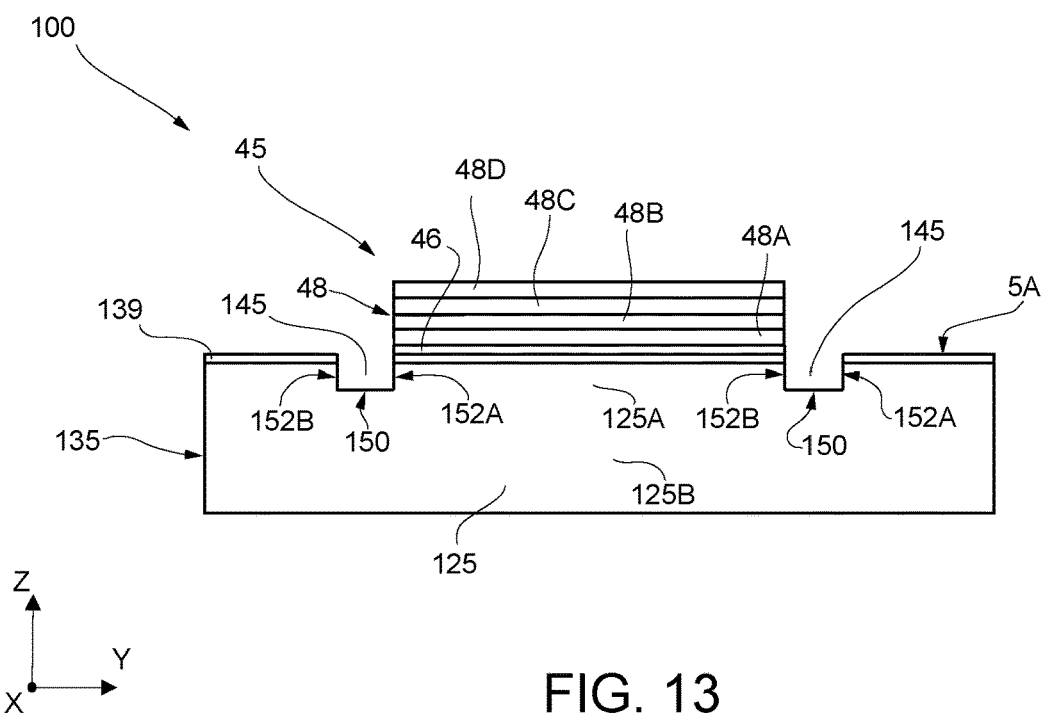
FIG. 13 shows a cross-section of the MEMS device of FIG. 12, taken along section line XIII-XIII of FIG. 12.
Figure 14:
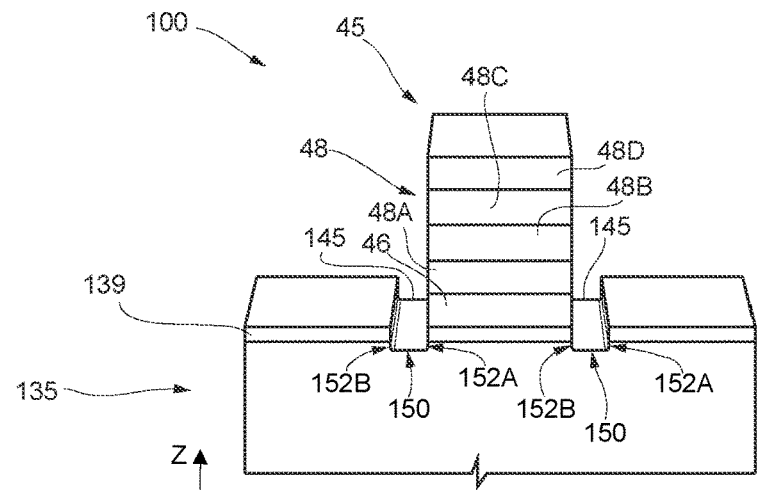
FIG. 14 shows a perspective view of the MEMS device of FIGS. 12 and 13.

FIGS. 12-14 show the present MEMS device according to a different embodiment. In particular, FIGS. 12-14 show a MEMS micromirror 100 having a general structure similar to the one of the MEMS micromirror 1 shown in FIG. 1; consequently, elements in common are provided with the same reference numbers.

In detail, also here the MEMS micromirror 100 is formed in the die 5 comprising the frame 10, which delimits the pass-through cavity 15, and the movable structure 20 suspended in the pass-through cavity 15 and coupled to the frame 10 through two elastic elements 125. The MEMS micromirror 100 further comprises the actuation structures 35, the contact pads 40 and the conductive tracks 45.

The elastic elements 125 are formed in a first substrate 135, similar to the first substrate 6 of the MEMS micromirror 1; an insulating layer 139 (similar to the insulating layer 9 of FIG. 2, thus formed by one or more insulating layers) extends on the first substrate 135 and delimits the first surface 5A of the die 5. The elastic elements 125 are also here bar-shaped or rod-shaped, with width $W^1$ along the second axis Y, and are constrained to the frame 10 and to the movable structure 20 through respective anchoring ends.

Also here, each elastic element 125 comprises a first and a second portion 125A, 125B, but these portions are contiguous, not separated by cavities.

A pair of trenches 145 extend, through the insulating layer 139, in the first substrate 135, on the side of each conductive track 45, for a portion of the thickness of the first substrate 135.

In detail, each trench 145 is delimited downwardly by a bottom wall 150 and laterally by a respective first side wall 152A and by a respective second side wall 152B of the first substrate 135. The bottom wall 150 and the side walls 152A, 152B form respective corners with respect to each other.

In particular, the depth of the trenches 145 is smaller than half the thickness of the first substrate 135. For example, the trenches 145 may have a depth comprised between 1 μm and 10 μm.

Thus, the trenches 145 laterally delimit the first portion 125A of the elastic elements 125, which therefore have a smaller thickness than the second portions 125B.

In use, when the movable structure 20 is actuated in rotation, the mechanical stress in the elastic elements 125 is more concentrated at the superficial portions of the first substrate 135 adjacent to the corners existing between the first side wall 152A and the bottom wall 150, and between the second side wall 152B and the bottom wall 150. In fact, the trenches 145 form discontinuity regions in the elastic elements 125.

The stress concentration in the superficial portions of the first substrate 135 adjacent to the corners, thus at a distance from the stack of conductive layers 48, is verified by simulations performed by the Applicant, not shown here.

Consequently, the stress is concentrated in a zone with greater mechanical resistance, since the first substrate 135, being of semiconductor material such as silicon, has high stress resistance (high plastic deformation threshold). The metal layers which form the conductive tracks 45 (and which have a lower plastic deformation threshold) are instead subject to a reduced stress value, for example lower than 200 MPa, thus they are subject to a stress that is lower than their plastic deformation threshold.

Consequently, the conductive tracks 45 have a lower risk of delamination and/or breakage, even in case of a high rotation angle of the movable structure 20, for example up to ±25°, in particular of about ±9°, with respect to the rotation axis A.

The MEMS micromirror 100 may be formed, from the work body 200 of FIG. 3, similarly to the MEMS micromirror 1, except that the buried cavities 30 are not formed, but the trenches 145 are formed on the side of the conductive tracks 45, as briefly described hereinbelow.

The first and the second insulating layers 233A, 233B, the conductive tracks 45, the contact pads 40, the actuation structures 35, the reflective region 27 and the pass-through cavity 15 are formed similarly to the MEMS micromirror 1.

Figure 15:
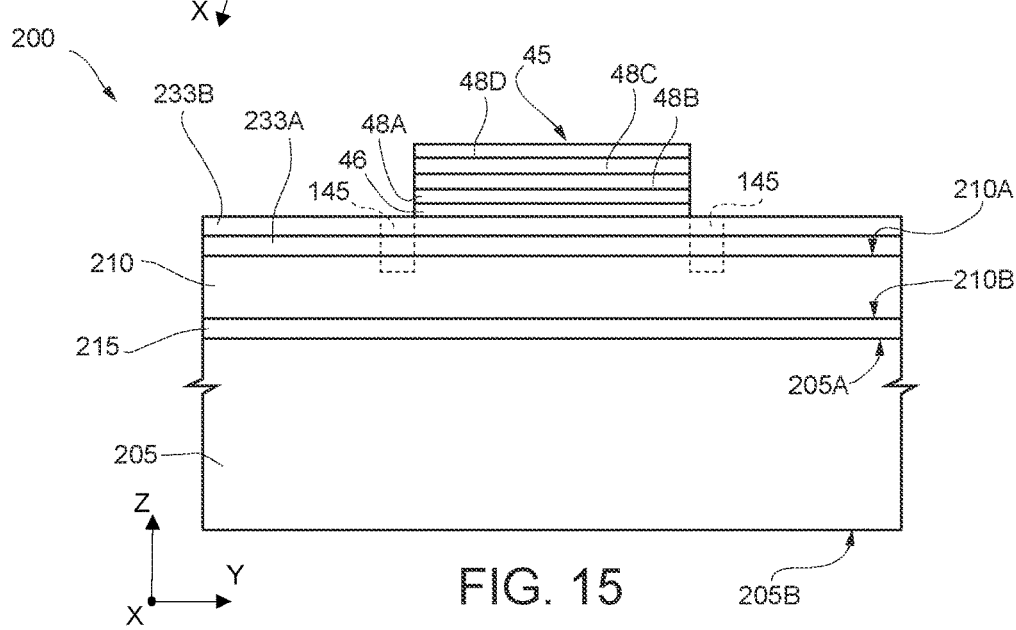
FIG. 15 shows a cross-section of the MEMS device of FIGS. 12-14 in an intermediate manufacturing step, in the same section plane as FIG. 13.

In detail, as shown in FIG. 15, the first and the second insulating layers 233A, 233B are deposited on the first surface 210A of the structural layer 210 and the conductive tracks 45 are formed as previously described with reference to the MEMS micromirror 1. Subsequently, the trenches 145 are formed by selectively removing portions of the structural layer 210, of the first and the second insulating layers 233A, 233B contiguous, along the second axis Y, to the conductive tracks 45 and identified for clarity with a dashed line in FIG. 15.

Then, the elastic elements 125 and the movable structure 20 are released, as described with reference to FIG. 11.

A further embodiment of the present MEMS device is described hereinafter.

Figure 16:
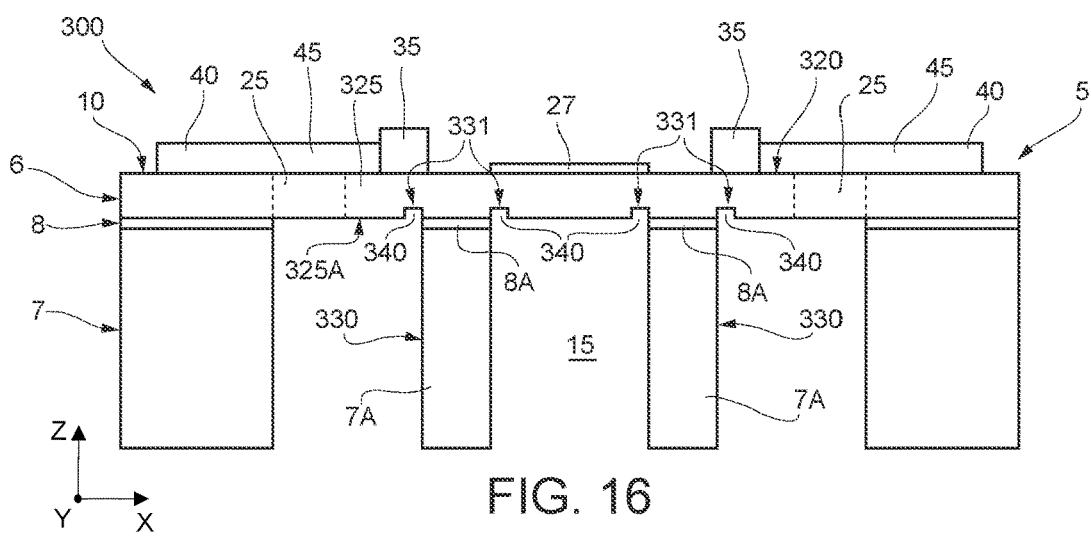
FIG. 16 shows a cross-section of a further embodiment of the present MEMS device.

In detail, FIG. 16 shows a MEMS micromirror 300, which, similarly to the MEMS micromirror 1, 100, is formed in the die 5 comprising the frame 10 surrounding a pass-through cavity 15, and a movable structure 320 suspended in the pass-through cavity 15 and fixed to the frame 10 through the elastic elements 25, which are delimited by a dashed line, for clarity, in FIG. 16.

The MEMS micromirror 300 further comprises the contact pads 40, the conductive tracks 45, the actuation structures 35 and the reflective region 27, similarly to what described regarding the MEMS micromirror 1, 100.

The movable structure 320 is formed by a platform 325, formed in the first substrate 6, and by one or more stiffening structures, here two stiffening structures 330.

Here, the stiffening structures 330 are formed by portions 7A of the second substrate 7 bonded to the platform 325 through portions 8A of the bonding element 8. The stiffening structures 330 thus extend, from the platform 325, through the pass-through cavity 15.

The MEMS micromirror 300 comprises trenches 340 each extending in the platform 325, from a bottom surface 325A thereof, up to a respective superficial portion 331, on the sides of each stiffening structure 330. The trenches 340 have a much smaller depth than the thickness of the platform 325, for example comprised between 1 μm and 50 μm.

In use, the movable structure 320 is subject to rotation, typically at a high frequency, for example of a few kilohertz. This generates mechanical stress in the movable structure 320 which tends to deform; the stiffening structures 330, on the other hand, oppose this deformation, causing a stress in the bonding zone of the stiffening structures 330 to the platform 325.

Similarly to what has been described for the MEMS micromirror 100, the trenches 340 represent discontinuities in the first substrate 6, which cause the stress to be concentrated inside the first substrate 6, in proximity to the bottom wall 331 of the trenches 340. In this manner, the highest stress values are concentrated far from the portions 8A of the bonding element 8, thus reducing the risk that the high stress causes a break of the portions 8A and thus a detachment of the stiffening structures 330.

It will be clear that the MEMS micromirror 300 may be manufactured, from the work body 200 of FIG. 3, in a manner similar to what has been described regarding the manufacturing of the MEMS micromirror 100.

Finally, it is clear that modifications and variations may be made to the MEMS device 1, 100, 300 and to the manufacturing process thereof described and illustrated herein, without thereby departing from the protective scope of this disclosure, as defined in the attached claims.

For example, the different described embodiments may be combined to provide further solutions.

For example, although in FIGS. 1 and 12, the elastic elements 25, 125 have a constant width, they may also have a different shape, for example they may have a non-constant width, or they may be dog-bone-shaped or folded, according to the stress resistance requirements desired by the specific application.

For example, the MEMS micromirror 1, 100 may be configured so to rotate also around a second rotation axis, transversal to the first rotation axis A.

Furthermore, the MEMS micromirror 1, 100, 300 may comprise other structures useful for its operation, for example detection structures such as piezoresistive sensors, in particular for detecting the rotation amplitude of the movable structure 20, 320, and the conductive tracks may electrically connect the contact pads to such other structures.

The present MEMS device may be different from a micromirror, for example, it may be a temperature sensor, a pressure sensor, or a microvalve, comprising movable and/or deformable structures suspended on a pass-through cavity and subject, in use, to high stress and wherein the buried cavities 30 or the trenches 145, 340 allow the stress to be concentrated at regions which are more resistant to stress, as described hereinabove.

For example, the buried cavities 30 may be formed by depositing a sacrificial layer, for example of silicon oxide, whereon semiconductor material, for example silicon, is then deposited and which may then be removed to form a cavity.

For example, the MEMS micromirror 300 may comprise, instead of the trenches 340, buried cavities, similar to the buried cavities 30 described with reference to the MEMS micromirror 1, arranged in the movable platform 325 and facing the stiffening structures 330.

The invention claimed is:

1. A process of manufacturing a MEMS device from a work body of semiconductor material, the process comprising:
    forming a buried cavity in the work body;
    forming a pass-through cavity in the work body, the pass-through cavity defining a support structure surrounding the pass-through cavity;
    forming a movable structure suspended in the pass-through cavity;
    forming an elastic structure extending in the pass-through cavity between the support structure and the movable structure and along a rotation axis of the MEMS device, wherein the buried cavity is formed to extend longitudinally within the elastic structure to separate a first portion of the elastic structure from a second portion of the elastic structure;

forming a metal region on the first portion of the elastic structure such that a width of the metal region along an axis transverse to both the rotation axis and an axis perpendicular to the rotation axis is less than a width of the elastic structure along the axis perpendicular to the rotation axis;

performing an etching on the elastic structure so that the buried cavity communicates laterally with the pass-through cavity.

2. The process of claim 1, wherein forming the buried cavity comprises:

excavating, from a first surface of the work body, a plurality of trenches delimiting semiconductor pillars;

growing an epitaxial layer on the first surface of the work body;

annealing the work body to thereby cause a migration of semiconductor atoms from the semiconductor pillars to the epitaxial layer;

forming of the buried cavity; and forming a closing layer.

3. The process according to claim 2, wherein each trench of the plurality of trenches has a depth comprised between 5 μm and 20 μm; and wherein each semiconductor pillar is separated at a distance comprised between 0.1 μm and 5 μm from an adjacent semiconductor pillar.

4. The process according to claim 1, wherein the work body is formed by a structural layer of a first semiconductor material and by a work substrate of a second semiconductor material, the structural layer being delimited by a first surface of the work body and by a bonding surface, opposite to the first surface of the work body, the work substrate being bonded to the bonding surface of the structural layer and being delimited by a second surface of the work body, opposite to the first surface; and wherein forming the pass-through cavity comprises:

selectively removing the work substrate from the second surface of the work body to the bonding surface of the structural layer to form a bottom cavity; and selectively removing the structural layer from the first surface of the work body to the bonding surface of the structural layer.

5. The process according to claim 4, wherein selectively removing the structural layer comprises:

forming a mask region on the first surface of the work body, the mask region defining a shaping portion having, on the buried cavity, a smaller width than the buried cavity; and etching the work body using the mask region, wherein the shaping portion defines the elastic structure.

6. A method of manufacturing a MEMS device, comprising:

forming a body of semiconductor material to define a support structure;

defining a pass-through cavity within the body of semiconductor material and surrounded by the support structure;

suspending a movable structure within the pass-through cavity;

extending an elastic structure in the pass-through cavity between the support structure and the movable structure and along a rotation axis of the MEMS device, the elastic structure having a first portion with a first work cavity defined therein and a second portion, wherein the elastic structure is subject to mechanical stress;

forming a metal region on the first portion of the elastic structure such that a width of the metal region along an axis transverse to both the rotation axis and an axis perpendicular to the rotation axis is less than a width of the elastic structure along the axis perpendicular to the rotation axis;

performing an etching on the elastic structure so that the first work cavity communicates laterally with the pass-through cavity to thereby form a buried cavity.

7. The method according to claim 6, wherein the first portion has a thickness between 1 μm and 10 μm and the second portion has a thickness between 10 μm and 400 μm.

8. The method according to claim 6, wherein a height of the buried cavity is between one fiftieth and one fifth of a thickness of the elastic structure.

9. The method according to claim 6, further comprising:

determining a length of the elastic structure along a first direction; and extending the buried cavity for an entirety of a length of the elastic structure along the first direction.

10. The method according to claim 6, further comprising extending the buried cavity to partially enter the movable structure and the support structure.

11. The method according to claim 6, wherein a width of the buried cavity, along a second direction, is equal to a width of the elastic structure.

12. The method according to claim 6, further comprising arranging a reflective region on the movable structure on a side opposite to the pass-through cavity provide a micromirror.

* * * * *